United States Patent
Wu et al.

(10) Patent No.: US 10,607,648 B1
(45) Date of Patent: *Mar. 31, 2020

(54) HEAD DELAY CALIBRATION AND TRACKING IN MSMR SYSTEMS

(71) Applicant: Seagate Technology LLC, Cupertino, CA (US)

(72) Inventors: Zheng Wu, San Jose, CA (US); Marcus Marrow, San Jose, CA (US); Jason Bellorado, San Jose, CA (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/025,363

(22) Filed: Jul. 2, 2018

Related U.S. Application Data

(63) Continuation of application No. 15/713,991, filed on Sep. 25, 2017, now Pat. No. 10,014,026.

(60) Provisional application No. 62/522,248, filed on Jun. 20, 2017.

(51) Int. Cl.
  *G11B 5/09* (2006.01)
  *G11B 20/10* (2006.01)

(52) U.S. Cl.
  CPC .... *G11B 20/10055* (2013.01); *G11B 20/1024* (2013.01); *G11B 20/10037* (2013.01)

(58) Field of Classification Search
  None
  See application file for complete search history.

(56) References Cited

U.S. PATENT DOCUMENTS

| | | | |
|---|---|---|---|
| 5,321,564 A | 6/1994 | Takahashi |
| 5,543,978 A | 8/1996 | Park |
| 5,654,765 A | 8/1997 | Kim |
| 5,742,532 A | 4/1998 | Duyne et al. |
| 5,970,093 A | 10/1999 | Lantremange |
| 6,157,510 A | 12/2000 | Schreck et al. |
| 6,222,592 B1 | 4/2001 | Patel |
| 6,320,920 B1 | 11/2001 | Beyke |
| 6,377,552 B1 | 4/2002 | Moran et al. |
| 6,505,222 B1 | 1/2003 | Davis et al. |
| 6,580,676 B1 | 6/2003 | Yanagisawa et al. |
| 6,633,894 B1 | 10/2003 | Cole |
| 6,665,308 B1 | 12/2003 | Rakib et al. |
| 6,687,073 B1 | 2/2004 | Kupferman |
| 6,697,891 B2 | 2/2004 | Emberty et al. |

(Continued)

*Primary Examiner* — Peter Vincent Agustin
(74) *Attorney, Agent, or Firm* — Setter Roche LLP; Christian W. Best

(57) ABSTRACT

Systems and methods are disclosed for head delay calibration and tracking multi-sensor magnetic recording (MSMR) systems. In certain embodiments, an apparatus may comprise a first reader and a second reader configured to simultaneously read from a single track of a data storage medium, the first reader offset from the second reader so that the first reader and the second reader detect a same signal pattern offset in time. The apparatus may further comprise a circuit configured to determine a relative offset between the first reader and the second reader, including setting a fixed delay for a first signal from the first reader, setting a second delay for a second signal from the second reader, and adjusting the second delay to align the second signal to the first signal using a timing loop, with the first signal used as a reference signal.

20 Claims, 8 Drawing Sheets

(56) References Cited

U.S. PATENT DOCUMENTS

| | | |
|---|---|---|
| 6,707,772 B1 | 3/2004 | Marrec et al. |
| 6,738,205 B1 | 5/2004 | Moran et al. |
| 6,738,215 B2 | 5/2004 | Yatsu |
| 6,950,258 B2 | 9/2005 | Takaishi |
| 6,993,291 B2 | 1/2006 | Parssinen et al. |
| 7,046,701 B2 | 5/2006 | Mohseni et al. |
| 7,133,233 B1 | 11/2006 | Ray et al. |
| 7,245,448 B2 | 7/2007 | Urata |
| 7,298,573 B2 | 11/2007 | Kitamura |
| 7,362,432 B2 | 4/2008 | Roth |
| 7,929,238 B1 | 4/2011 | Vasquez |
| 7,940,667 B1 | 5/2011 | Coady et al. |
| 7,948,703 B1 | 5/2011 | Yang |
| 8,139,301 B1 * | 3/2012 | Li ............... G11B 5/012 360/39 |
| 8,172,755 B2 | 5/2012 | Song et al. |
| 8,400,726 B1 | 3/2013 | Wu et al. |
| 8,514,506 B1 | 8/2013 | Li et al. |
| 8,542,766 B2 | 9/2013 | Chekhovstov et al. |
| 8,724,245 B1 | 5/2014 | Smith et al. |
| 8,755,139 B1 | 6/2014 | Zou et al. |
| 8,760,794 B1 | 6/2014 | Coker et al. |
| 8,767,341 B1 | 7/2014 | Coker et al. |
| 8,780,477 B1 | 7/2014 | Guo et al. |
| 8,837,068 B1 | 9/2014 | Liao et al. |
| 8,861,111 B1 | 10/2014 | Liao et al. |
| 8,861,112 B1 | 10/2014 | Pan et al. |
| 8,953,276 B1 * | 2/2015 | Pokharel ........ G11B 5/596 360/75 |
| 9,007,707 B1 | 4/2015 | Lu et al. |
| 9,019,642 B1 * | 4/2015 | Xia ........... G11B 20/10009 360/25 |
| 9,025,269 B1 | 5/2015 | Wong et al. |
| 9,064,537 B1 | 6/2015 | Nie et al. |
| 9,082,418 B2 | 7/2015 | Ong et al. |
| 9,093,115 B1 | 7/2015 | Fung et al. |
| 9,099,132 B1 * | 8/2015 | Grundvig ......... G06F 16/245 |
| 9,129,650 B2 | 9/2015 | Mathew et al. |
| 9,196,298 B1 | 11/2015 | Zhang et al. |
| 9,245,578 B1 * | 1/2016 | Wang ......... G11B 20/10018 |
| 9,245,579 B2 | 1/2016 | Song et al. |
| 9,245,580 B1 | 1/2016 | Lu et al. |
| 9,257,135 B2 | 2/2016 | Ong et al. |
| 9,257,145 B1 | 2/2016 | Soderbloom et al. |
| 9,311,937 B2 | 4/2016 | Zou et al. |
| 9,401,161 B1 | 7/2016 | Jury et al. |
| 9,424,878 B1 | 8/2016 | Dziak et al. |
| 9,431,052 B2 | 8/2016 | Oberg et al. |
| 9,508,369 B2 | 11/2016 | Chu et al. |
| 9,564,157 B1 | 2/2017 | Trantham |
| 9,590,803 B2 | 3/2017 | Derras et al. |
| 9,672,850 B2 | 6/2017 | Grundvig et al. |
| 9,728,221 B2 | 8/2017 | Oberg et al. |
| 9,819,456 B1 | 11/2017 | Bellorado et al. |
| 9,947,362 B1 | 4/2018 | Venkataramani et al. |
| 10,014,026 B1 * | 7/2018 | Wu .................. H03K 5/135 |
| 10,177,771 B1 | 1/2019 | Bellorado et al. |
| 2004/0228397 A1 | 11/2004 | Bach |
| 2005/0117243 A1 | 6/2005 | Serizawa |
| 2005/0270687 A1 * | 12/2005 | Zweighaft ......... G11B 5/584 360/77.12 |
| 2007/0139805 A1 | 6/2007 | Mead |
| 2007/0139806 A1 | 6/2007 | Southerland et al. |
| 2007/0177292 A1 | 8/2007 | Bui et al. |
| 2008/0158711 A1 | 7/2008 | Bliss et al. |
| 2008/0175309 A1 | 7/2008 | Fimoff et al. |
| 2009/0141386 A1 | 6/2009 | Miura |
| 2009/0323214 A1 | 12/2009 | Grundvig et al. |
| 2010/0290153 A1 | 11/2010 | Hampshire |
| 2011/0002375 A1 | 1/2011 | Honma |
| 2011/0176400 A1 | 7/2011 | Gerasimov |
| 2012/0105994 A1 | 5/2012 | Bellorado et al. |
| 2013/0076433 A1 | 3/2013 | Fratti |
| 2015/0003221 A1 | 1/2015 | Sankaranarayanan et al. |
| 2015/0022916 A1 * | 1/2015 | Zou ............... G11B 5/455 360/31 |
| 2015/0279398 A1 | 10/2015 | Fan et al. |
| 2015/0380048 A1 * | 12/2015 | Oberg ......... G11B 20/10037 360/32 |
| 2016/0019921 A1 * | 1/2016 | Bui ............... G11B 5/56 360/76 |
| 2016/0112218 A1 | 4/2016 | Abe |

\* cited by examiner

HEAD DELAY CALIBRATION AND TRACKING IN MSMR SYSTEMS

CROSS-REFERENCE TO RELATED APPLICATION

The present application is a non-provisional application of and claims priority to: U.S. provisional patent application, Application No. 62/522,248, filed Jun. 20, 2017, entitled "MISO Systems and Methods"; and to pending U.S. patent application Ser. No. 15/713,991, filed Sep. 25, 2017, entitled "HEAD DELAY CALIBRATION AND TRACKING IN MSMR SYSTEMS", the contents of which are hereby incorporated by reference in their entirety.

SUMMARY

In certain embodiments, an apparatus may comprise a first reader and a second reader configured to simultaneously read from a single track of a data storage medium, the first reader offset from the second reader so that the first reader and the second reader detect a same signal pattern offset in time. The apparatus may further comprise a circuit configured to determine a relative offset between the first reader and the second reader, including setting a fixed delay for a first signal from the first reader, setting a second delay for a second signal from the second reader, and adjusting the second delay to align the second signal to the first signal using a timing loop, with the first signal used as a reference signal. The circuit may execute read operations based on the relative offset.

In certain embodiments, a method may comprise performing a delay calibration operation for a first reader and a second reader configured to simultaneously read from a single track of a data storage medium, the first reader offset from the second reader so that the first reader and the second reader detect a same signal pattern offset in time. The delay calibration operation may include determining a relative offset between the first reader and the second reader, including setting a fixed delay for a first signal from the first reader, setting a second delay for a second signal from the second reader, adjusting the second delay to align the second signal to the first signal using a timing loop, with the first signal used as a reference signal, and storing delay values for the first reader and the second reader based on the relative offset.

In certain embodiments, an apparatus may comprise a first receiver and a second receiver configured to simultaneously receive a data signal, the first receiver offset from the second receiver so that the first receiver and the second receiver detect a same signal pattern offset in time. The apparatus may further comprise a circuit configured to determine a relative offset between the first receiver and the second receiver, including adjusting an adjustable delay of a second signal from the second receiver to align the second signal to a first signal from the first receiver using a timing loop, with the first signal used as a reference signal. The timing loop may include multiple selectable settings, including a first mode having a first pull-in range and a first noise output level, the first pull-in range defining a timing window in clock cycles centered around the adjustable delay, wherein the timing loop will converge if an actual delay between the first reader and the second reader is within the timing window, and a second mode having a second pull-in range narrower than the first pull-in range, and a second noise level less than the first noise level. The circuit may execute read operations based on the determined relative offset.

DETAILED DESCRIPTION

In the following detailed description of certain embodiments, reference is made to the accompanying drawings which form a part hereof, and in which are shown by way of illustration of example embodiments. It is also to be understood that features of the embodiments and examples herein can be combined, exchanged, or removed, other embodiments may be utilized or created, and structural changes may be made without departing from the scope of the present disclosure.

In accordance with various embodiments, the methods and functions described herein may be implemented as one or more software programs running on a computer processor or controller. Dedicated hardware implementations including, but not limited to, application specific integrated circuits, programmable logic arrays, and other hardware devices can likewise be constructed to implement the methods and functions described herein. Methods and functions may be performed by modules, which may include one or more physical components of a computing device (e.g., logic, circuits, processors, etc.) configured to perform a particular task or job, or may include instructions that, when executed, can cause a processor to perform a particular task or job, or any combination thereof. Further, the methods described herein may be implemented as a computer readable storage medium or memory device including instructions that, when executed, cause a processor to perform the methods.

Figure 1:
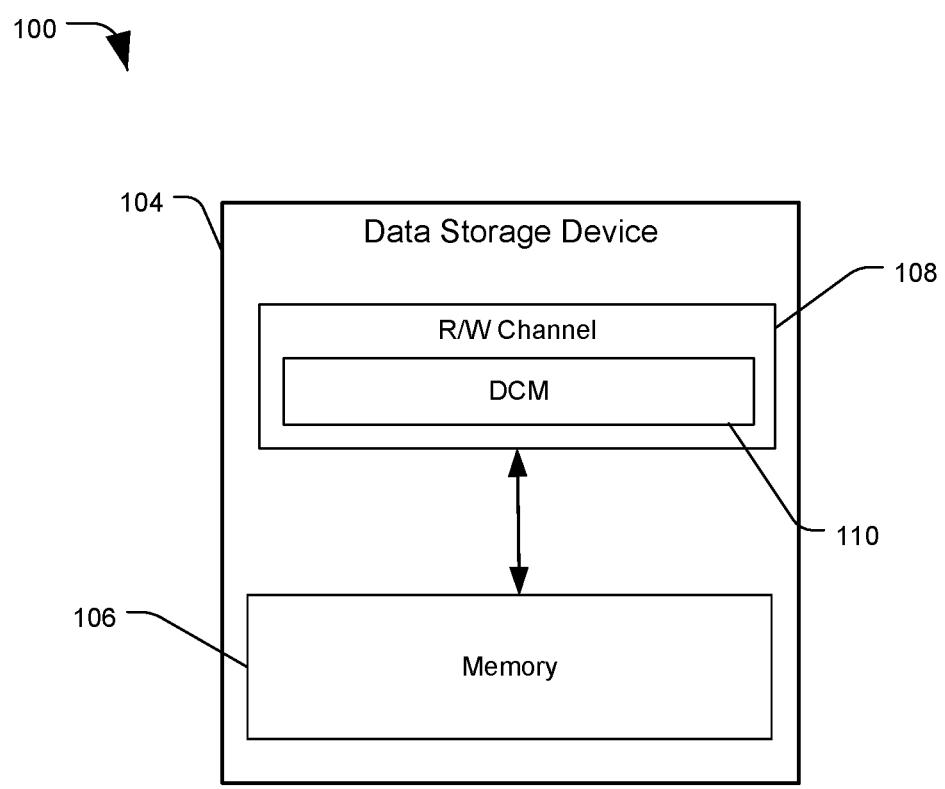
FIG. 1 is a diagram of a multi-sensor magnetic recording (MSMR) system configured to perform head delay calibration and tracking, in accordance with certain embodiments of the present disclosure.

FIG. 1 is a diagram of a multi-sensor magnetic recording (MSMR) system, generally designated 100, configured to perform head delay calibration and tracking, in accordance with certain embodiments of the present disclosure. The system 100 may include a data storage device (DSD) 104. The DSD 104 may be any device which may be used to store or retrieve data, such as a data storage drive specifically designed for data storage (e.g. a hard disc drive (HDD) or hybrid hard drive HHD), a more general-purpose computing device including data storage capabilities (e.g. a desktop computer, a laptop computer, a server, a tablet computer, a telephone, a music player, etc.), another electronic device, or any combination thereof.

The DSD 104 may include a memory 106 and a read/write (R/W) channel 108. During operation, the DSD 104 may receive a data access request, such as a read or write request, for example from a host device. In response, the DSD 104 may perform data access operations on the memory 106 via the R/W channel 108 based on the request.

The R/W channel 108 may comprise one or more circuits or processors configured to process signals for recording to or reading from the memory 106. The memory 106 may include a magnetic storage medium such as a hard disc, which may have data stored to concentric or spiral data tracks on the surface of the media. The tracks on the surface may be divided into zones, with each zone having a set of contiguous data tracks (e.g. an inner zone closest to the inner diameter (ID) or center of the disc, a middle zone, and an outer zone closest to the outer diameter (OD) or outer edge of the disc, although discs may be configured with many more than three zones). Data can be stored to the tracks via setting localized polarity of magnetic fields on the surface of the disc. The magnetic fields may be detected by a reader element, sometimes called a read head, and the reader may generate a signal in the form of an analog waveform based on the detected magnetic fields. The R/W channel can receive and process the signal to obtain data, for example in the form of a sequence of bits. Similarly, digital data can be processed by the R/W channel 108 and converted into a signal that can be stored to the memory 106 via a writer or write head, by generating a magnetic field based on the signal. In some embodiments, the reader and writer elements may be referred to collectively as transducers or the "head(s)" of a data storage system. The heads may be located on a movable actuator arm that can position the heads over a desired location on the media. As the media spins, data can be read from or recorded to one or more tracks using the heads.

The DSD 104 may be a multi-sensor magnetic recording (MSMR) system, which may use multiple reader elements over a single storage media surface to sense the magnetic field from the same track of the media simultaneously during a read operation. Each of the N readers (with "N" being an integer value greater than one) may have a corresponding analog front end (AFE) and analog to digital converter (ADC) in the R/W channel 108. The AFE and ADC may be configured to perform gain, filtering and sampling functions on the signal from the reader to produce a stream of sample values. When these N sample streams are correctly combined in the R/W channel 108, the multi-reader system can provide signal to noise ratio (SNR) and bit error rate (BER) gains over a single reader system. Although the heads may be very close to each other on the arm, they may still be separated across the track as well as down the track. Since the heads may be located over different positions over the track, the signals each head detects may not be aligned in time, which can make combining the signals difficult.

Accordingly, DSD 104 may include a delay calibration module (DCM) 110, located within the R/W channel 108, a data storage controller, or elsewhere in the DSD 104. The DCM 110 may perform the methods and processes described herein to determine and set a delay between heads for various locations of the disc, such that the read signals can be aligned in time and coherently combined to improve system performance. An example arrangement of reader elements in an MSMR system is depicted in regard to FIG. 2.

Figure 2:
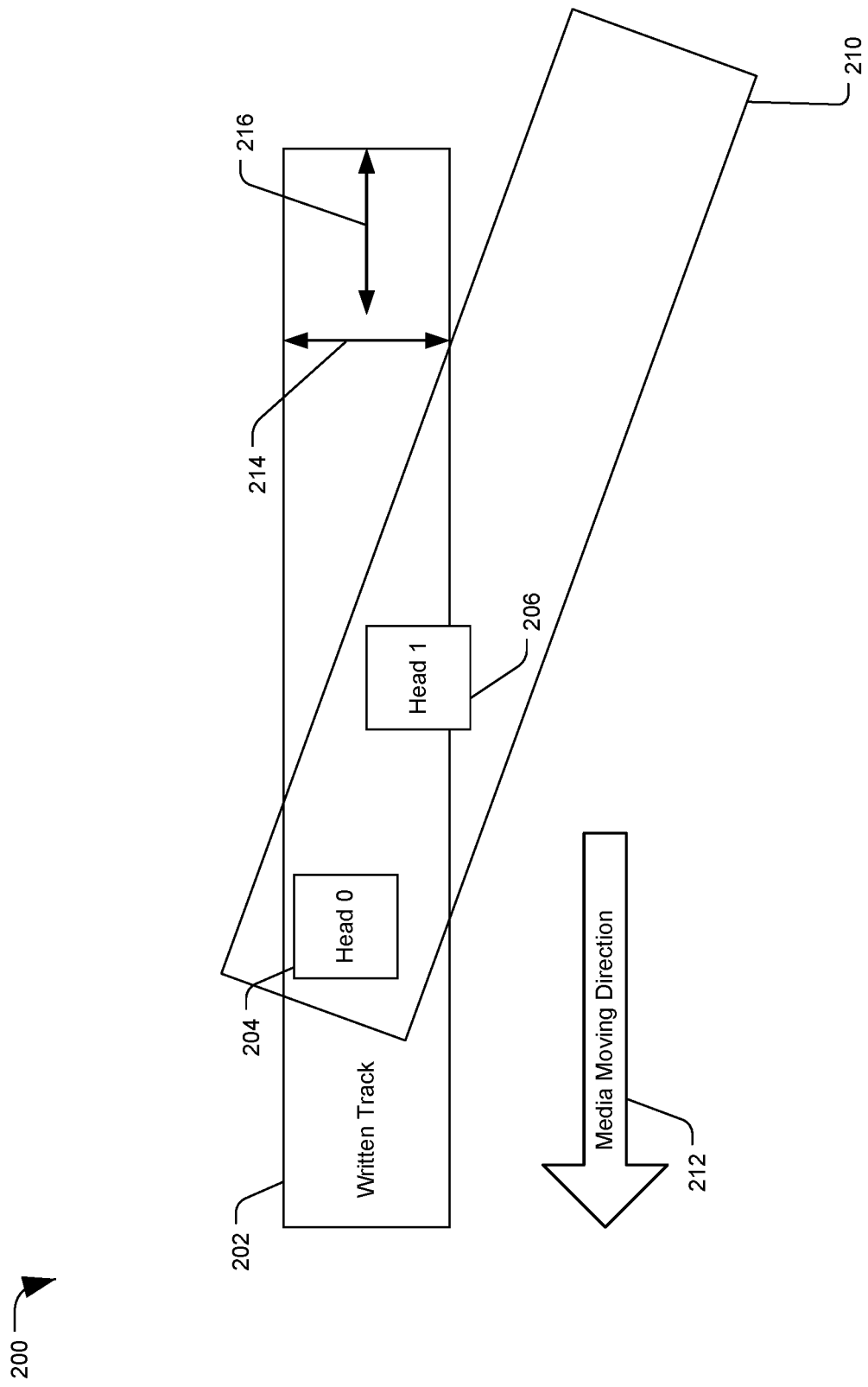
FIG. 2 is a diagram of an MSMR system configured to perform head delay calibration and tracking, in accordance with certain embodiments of the present disclosure.

FIG. 2 is a diagram of an MSMR system configured to perform head delay calibration and tracking, generally designated 200, in accordance with certain embodiments of the present disclosure. The system 200 can include a written data track 202 of a storage medium, such as a hard disc. The track 202 may have data recorded thereto by means of polarized magnetic fields along the track. In an MSMR system, a DSD may have a plurality (e.g. an integer "N") of analog waveforms produced from the track 202 by a plurality ("N") of read heads, such as reader 0 204, and reader 1 206. Although two heads are depicted, more heads may also be used. The heads can each have a cross-track 214 and down-track 216 position, and may be offset from each other in a cross-track and down-track direction. Reader 0 204 and reader 1 206 may be connected to an adjustable arm 210, which can position the readers over a desired track. The cross-track 214 and down-track 216 positioning and offset of each head may change from zone to zone or track to track, depending on the angle of the arm 210 relative to the media. The down-track 216 offsets between the readers may translate to a delay between readers for a given signal pattern from the track. The cross-track 214 positions of the readers may influence a relative signal strength or reliability of a given reader in reading the recorded signal. For example, a head that is more centered over the track 202 may provide a more accurate reproduction of the recorded signal than a head that is partially off-track.

The arm 210 can position the heads over a desired track 202, and the track moves as the disc media spins, allowing the heads to read data from the entire track. The disc media may be spinning in the direction indicated by the arrow 212. In this example, reader 1 206 would be the leading head (e.g. the first head to read a specific location on the track), followed by reader 0 204 as the trailing or tailing head. The leading head 206 along the track 202 may output the same signal earlier than the tailing head 204. Therefore, the signal read by head 0 204 may be delayed compared to the signal read by head 1 206. An example of the signal delay may be seen in FIG. 3.

Figure 3:
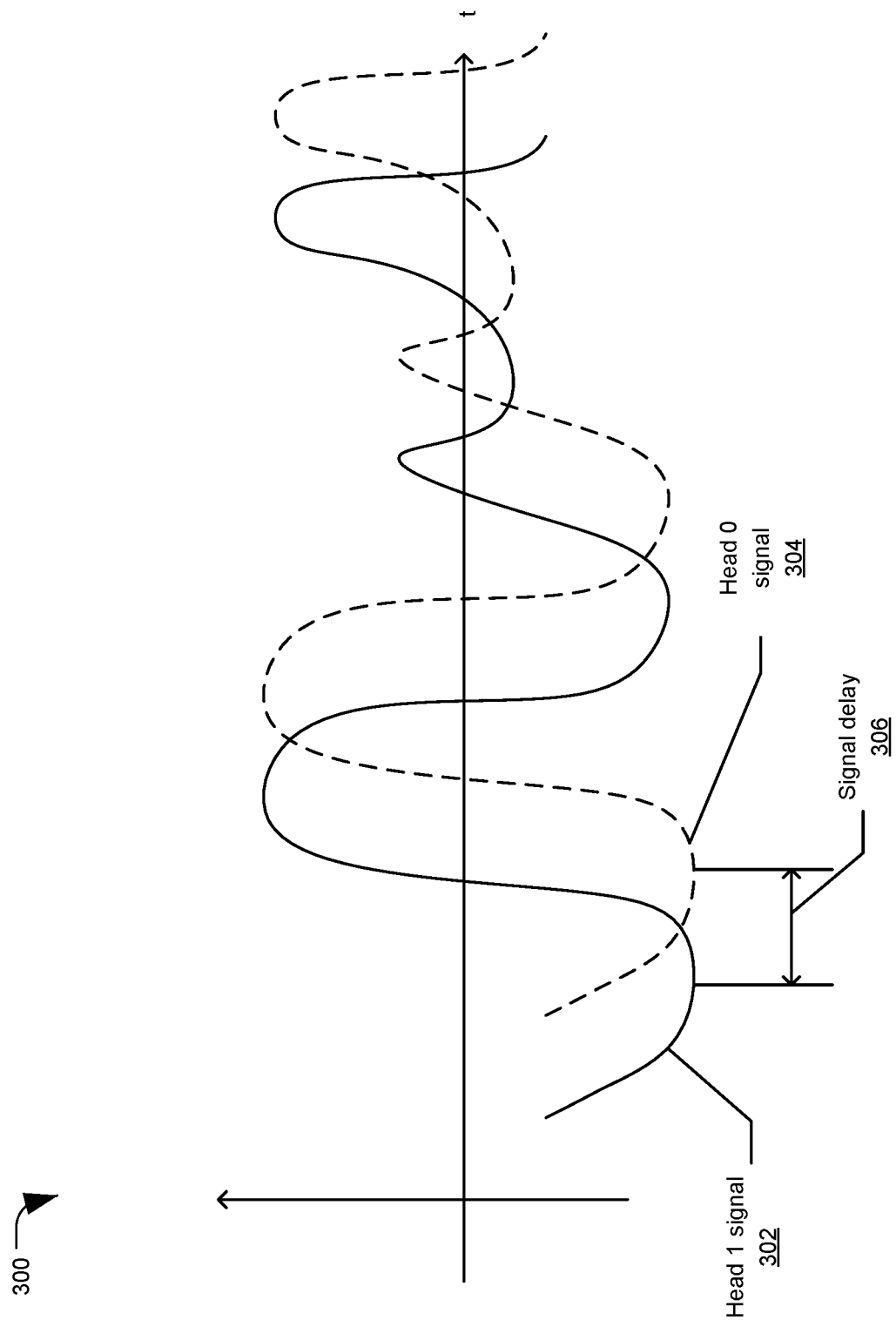
FIG. 3 is a diagram of signals from offset heads in an MSMR system configured to perform head delay calibration and tracking, in accordance with certain embodiments of the present disclosure.

FIG. 3 is a diagram, generally designated 300, of signal delay in an MSMR system configured to perform head delay calibration and tracking, in accordance with certain embodiments of the present disclosure. Diagram 300 depicts the signal detected from the data track 202 of FIG. 2 along a time axis t. In particular, a first signal from the leading head 1 206 of FIG. 2 appears first along the time axis as the head 1 signal 302. A second signal from the trailing head 0 204 of FIG. 2 then appears, denoted by head 0 signal 304. Head 1 signal 302 and head 0 signal 304 are the same signal read from track 202, offset in time by a duration represented by a signal delay 306. Although the actual signal patterns from different heads may slightly differ due to, e.g. head irregularities and cross-track positioning, the signal patterns from different heads may be substantially similar.

The delay 306 (e.g. in clock cycles) between the two signals may be determined by the down-track 216 offset between head 0 204 and head 1 206, as well as the spin speed of the disc and the read clock frequency. Because the skew angle of the head arm 210 changes from OD to ID, the offsets between the heads, and the corresponding delay 306, may change as well.

As discussed herein, a disc may be divided into many zones of contiguous tracks. Tracks in the same zone may be regarded to be at a similar radius and may use the same data frequency. A calibration procedure may be performed for each zone (or other grouping of tracks, including individual tracks) to determine a delay between heads in an MSMR system before read signals can be combined together. The read channel may use the delay information to account for the changing delays between heads at different radial positions of the disc. The calibration procedure for head delay calibration may be performed during a manufacturing process, with the determined delays stored to the device for later use, or the calibration procedure may be performed by the drive during operation. During normal reading processes, if the delay changes slightly due to any reason (e.g. slight variation between tracks within a zone, thermal changes, or head misalignment due to jarring), the read channel may be configured to perform delay tracking to adjust to those slight changes.

One method to determine the relative delay between two read-back signal streams of the same data pattern may be to correlate the two signals and find out the position of the maximum correlation. However, the implementation complexity of such an approach may be high, and prohibitive to implement within a drive.

Another approach to determining the relative delay between two streams may be to use a timing loop to align the signal streams. One of the signals may be selected as a reference signal, with no delay or a fixed delay. The timing loop can then be used during a calibration procedure to adjust the other signal's phase to align to the reference signal. The timing loop can compute the timing error between the second signal and the reference signal, and gradually adjust the delay (e.g. and correspondingly, the phase) of the second signal until the two signals are aligned.

The timing loop may have a limited phase difference range within which it can match the two signals and converge them until the signals align, which may be referred to as the "pull-in range." In order to cover a larger search range of delay values than the pull-in range of the loop, multiple trials may need to be performed using different initial delay estimates for the second signal until a converging trial is found. When a converged trial is found, the delay between the two signals may be determined and locked in or saved for later use.

In order to mitigate the number of trials that need to be performed, the proposed system may also include an adjustable pull-in range, for example by modifying the equations used by the timing loop to detect matching signal patterns. The adjustable system may use different "gears" to apply different pull-in ranges, with a high gear configuration having a wide pull-in range but producing noisier delay value results, and a low gear having a narrower pull-in range but producing cleaner delay value results. The pull-in range adjustment process may be referred to as "gearing." A convergence monitor may be used to automatically shift the gears such that the timing loop has a wide pull-in range at the beginning of each calibration trial, and shifting to lower gears as an error metric between the signals is reduced, producing a smaller noise level when converged.

When a converged trial is found and the delay between the two signals is determined during a calibration process (e.g. during manufacturing or an initialization procedure for the drive), the delay value for the corresponding location of the memory (e.g. the current zone) may be stored to system memory for use during drive input/output (I/O) operations. During normal operation (e.g. read operations), the timing loop may also be used to track any phase change between the signals from different heads.

The described delay tracking and calibration procedure can be used not only for a two-head system, but multiple-head systems as well. Multiple calibration modules may be included in the system (e.g. for N heads, N−1 calibration modules may be included). Only one reference head may be chosen, and all the other heads can be calibrated relative to the reference head simultaneously through one read. In another embodiment, a single calibration module may be used, with each pair of heads calibrated one at a time. For example, a single reference head 0 may be selected, and a first calibration procedure can determine the delay between head 0 and head 1, a second calibration procedure can determine the delay between head 0 and head 2, etc. A system implementing the described delay calibration and tracking system is discussed in regard to FIG. 4.

Figure 4:
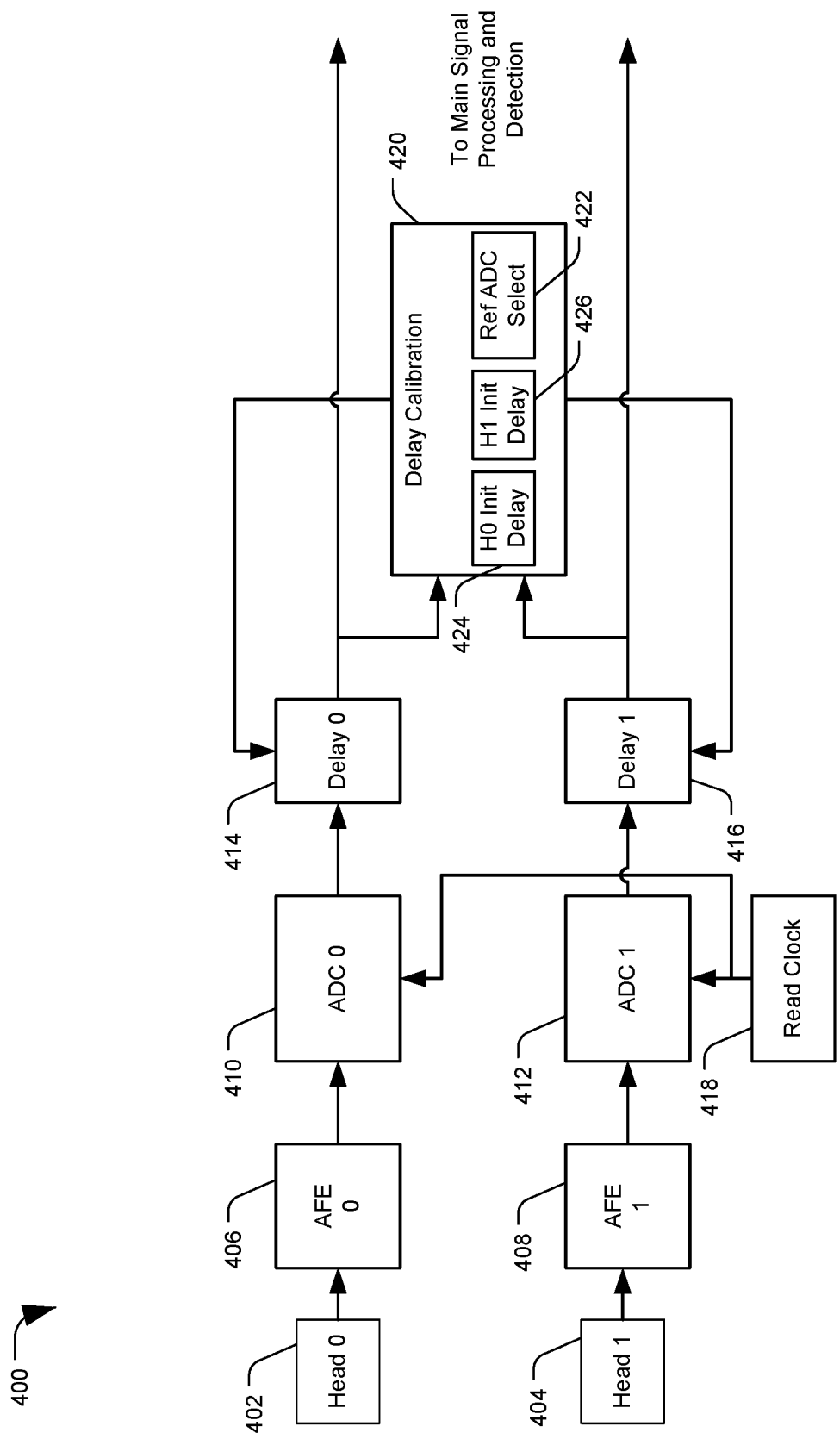
FIG. 4 is a diagram of an MSMR system configured to perform head delay calibration and tracking, in accordance with certain embodiments of the present disclosure.

FIG. 4 is a diagram of an MSMR system configured to perform head delay calibration and tracking, generally designated 400, in accordance with certain embodiments of the present disclosure. The system 400 may include components of a read channel, such as R/W channel 108 of FIG. 1.

The system 400 may include two read heads and two data paths corresponding to the two reader elements. Read head 0 402 may detect a signal, which may be processed by analog front end (AFE) 0 406. The AFE 0 406 may provide an analog signal to an analog to digital converter (ADC) 0 410, which may produce digital sample values (e.g. a sample stream) which are provided to a delay 0 circuit or module 414. Likewise, a second read head 1 404 and AFE 1 408 may provide a signal to ADC 1 412, which may provide a sample stream to delay 1 416. Both ADC 0 410 and ADC 1 412 may sample the corresponding analog signals based on a single read clock 418. Delay 0 414 and delay 1 416 may be configured to delay the corresponding sample values by different delay values based on a down-track offset between the heads, so that the samples will be aligned relative to the same portion of the data track. The delay value applied by each delay circuit can be programmed (e.g. from registers) as a fixed delay, or controlled by internal circuits adaptively. The delay circuits may be configured to apply delays with a precision down to a small fraction of the sampling clock period T, such that the delay between the two heads can be accurately calibrated. After the delay modules have delayed the sample values for the selected time period, they may send the values further down the R/W channel for main signal processing and detection.

The delay modules may also output the sample values to a delay calibration circuit or module 420. The delay calibration circuit 420 may be configured to receive the delay module outputs as input, and feedback a phase adjustment back to whichever delay module is being adjusted. For example, assume that the head 0 402 signal is selected as the reference signal. Therefore, the delay module 0 414 may be programmed with a fixed delay. The calibration block 420 may then adjust the delay of the second signal at delay 1 416 gradually through a timing loop to align the second signal to the reference signal.

The system can be designed such that the signal from either head can be the reference signal. The delay calibration circuit 420 can include a control (e.g. a programmable register) to select the reference signal, such as the reference ADC select block 422. For example, the Ref ADC Select register 422 may store a value identifying a particular delay module as corresponding to the reference signal, and the delay calibration circuit 420 may accordingly set a fixed delay for the reference signal and send the output of the timing loop phase adjustments to the other delay module.

The delay calibration circuit 420 may also have configurable registers for setting an initial delay for each delay circuit. For example, the H0 Init Delay block 424 may set the initial delay value for the head 0 402 delay circuit 414, and the H1 Init Delay block 426 may set the initial delay value for the head 1 404 delay circuit 416. For example, if head 0 402 is selected as the reference head, the delay value at delay 0 414 may be set to a fixed value; e.g. 0 T, 8 T, 16 T, or other values, based on a value stored to the H0 Init Delay register 424. The reference head may be the leading head or the trailing head, and in some embodiments a user or the system 400 may not know which. Accordingly, a positive delay value may be set for the reference head instead of no delay, as the signal to be adjusted may correspond to a head having a down-track offset before or after the reference head. In other words, the signal being adjusted may have a negative relative delay compared to the reference signal, indicating that the adjusted signal's head is the leading head and the reference signal head is the trailing head. So assuming reference signal 0 is set with a fixed 16 T delay, the system may determine that the adjusted signal has a −3 T relative delay, indicating it is the leading head, so that the adjusted signal would be delayed by 13 T to be aligned with the reference signal that is delayed by 16 T.

In practice, one might initially set the reference head delay at one extreme of the delay range and search for convergence along the entire delay range, and if no convergence is found, set the reference head delay to the other extreme of the delay range and again search the entire delay range for convergence. One extreme may cover situations where the reference head is the leading head, and the other situation may cover situations where the reference head is the tailing head, while providing a wide range of possible delays between heads to search. For example, with a 0-16 T delay range, a testing process may include setting the delay of the reference head to 0 T (or close to 0), and searching for convergence over the 16 T range. If all such trials fail to converge, the process may include setting the reference signal delay to maximum (or close to maximum), such as 16 T, and searching for convergence again along the 0 T to 16 T range. This may account for situations in which the relative offset between heads is as great as 16 T in either direction. In another embodiment, the reference head delay may be set to a middle value, such as 8 T, but in that case the 0 T-16 T range may only allow for searching for a relative offset of 8 T before or after the reference head instead of 16 T.

A user conducting the head delay calibration may have prior knowledge of the head position, such as which head is leading or tailing, or the relative delay range that may need to be searched based on the distance between heads. Such knowledge may be used to reduce the searching range to only one side of the reference head, or to select a delay range to be searched relative to the reference head.

Once the delay for reference head 0 402 is set, the delay for head 1 404 relative to head 0 may then be determined by setting an initial delay for head 1 at delay 1 416, and running a timing loop at the delay calibration circuit 420 to determine if the actual delay between head 0 and head 1 is within the pull-in range of the timing loop based on the initial head 1 delay value 426. If not, the value of H1 Init delay 426 may be adjusted to a different initial value, and a new timing loop trial run to determine if the signals for head 0 402 and head 1 404 converge. The signals will either start to converge, or they may diverge and a new initial delay value for head 1 404 will be selected until the proper delay for head 1 is determined. Initially, the delay calibration circuit 420 may apply a "high gear" algorithm that has a large pull-in range in order to minimize a number of trial runs that need to be performed to align the signals. Once the signals begin to converge, for example based on comparing an error metric based on the two signals to a threshold value, the delay calibration circuit 420 may shift "gears" on the timing loop to a setting with a smaller pull-in range but less noisy delay value output signal for more fine-tuned phase adjustment. A diagram providing an example breakdown of the delay calibration circuit 420 may be seen in FIG. 5.

Figure 5:
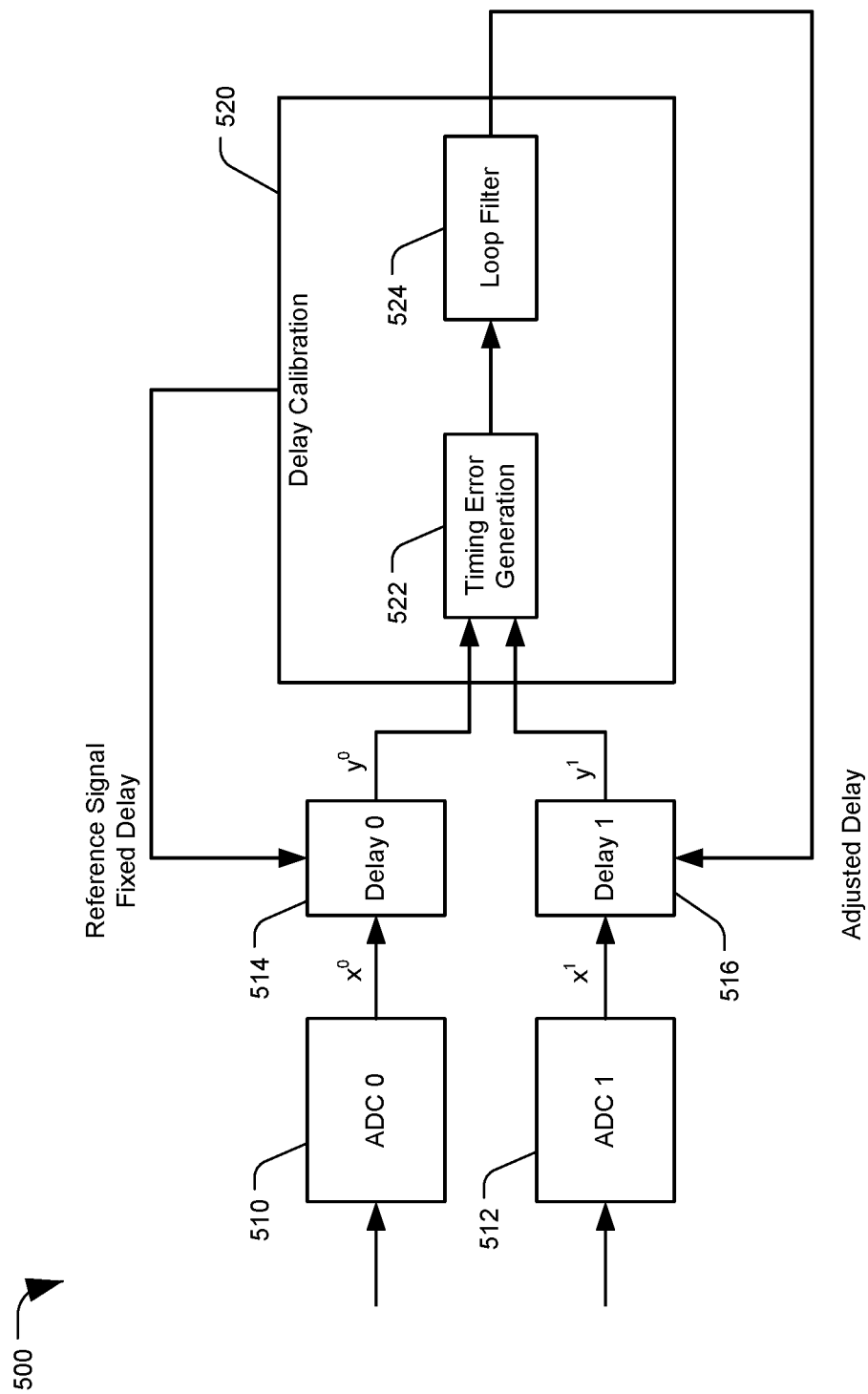
FIG. 5 is a diagram of an MSMR system configured to perform head delay calibration and tracking, in accordance with certain embodiments of the present disclosure.

FIG. 5 is a diagram of an MSMR system configured to perform head delay calibration and tracking, generally designated 500, in accordance with certain embodiments of the present disclosure. The system 500 may correspond to an example embodiment of the read channel 400 of FIG. 4.

As in FIG. 4, the system 500 may include an ADC 0 510 corresponding to a head 0 (not shown), which may send a first digital sample stream $x^0$ to a delay 0 circuit 514, and an ADC 1 512 corresponding to a head 1 (not shown), which may send a second digital sample stream $x^1$ to a delay 1 circuit 516. In the embodiment of FIG. 5, head 0 may be selected as the reference head, so that a fixed delay value is set at delay 0 514.

The delayed sample stream outputs from delay 0 514 and delay 1 516, labeled $y^0$ and $y^1$, respectively, may be provided to a delay calibration circuit 520. The delay calibration circuit 520 may having a timing loop including a timing error generation block or module 522 and a loop filter block or module 524. The sample stream input from delay 0 514 may be labeled $y^0$, and may be the reference signal. The sample stream input from delay 1 516 may be labeled $y^1$, may be the signal for which the delay will be adjusted. The input signal $y^1$ may be compared to $y^0$ at the timing error generation block 522 to generate a timing error, which can be filtered at the loop filter 524 and used to adjust the phase of $y^1$ by adjusting the delay value at delay 1 516. The phase of the reference signal $y^0$ may remain constant during this procedure. When converged, the phase difference between $y^0$ and $y^1$ may be close to zero.

As discussed herein, the phase difference between the two signals may not be specifically known before the calibration process. A timing loop may be used to determine the phase difference and the relative delay between the signals. A timing loop may have a pull-in range of the initial phase difference between the two signals $y^0$ and $y^1$, defined by some span of time defined in clock cycles "T". Therefore the pull-in range of a timing loop may be from −1 T to 1 T, for example, which is a 2 T span, centered at 0. As the signals $x^0$ and $x^1$ are based on reading the same data but offset in time, the phase difference between $y^0$ and $y^1$ may be based on the delay values set at the corresponding delay modules. If the values set at the delay modules are close enough to target delay values which will nearly eliminate the actual relative delay between the signals $x^0$ and $x^1$, then the phases of the signals $y^0$ and $y^1$ will be within the pull-in range of the delay calibration module's 520 timing loop. If the phases of the signals are within the pull-in range, the delay value at delay 1 516 can be adjusted until the phases of $y^0$ and $y^1$ converge and are nearly identical. However, if the delay values set at the delay modules are not close enough to the target values, the phase difference between $y^0$ and $y^1$ may be too great and outside the timing loop's pull-in range. In that case, the timing loop may diverge, and be unable to adjust the delay 1 516 value to make the phases of the signals align.

Therefore, when considering the system 500 as a whole, the pull-in range of the timing loop may be considered to define the size of a "window" that can be used to search a set of possible delay values from the full range of possible delay values for the specific delay between the signals. For example, the full range of possible delay values may be from 0 to 10 T in size, while the pull-in range may be 2 T in size, centered on an initial delay value at delay 1 516 set for the signal being adjusted. Setting a delay at delay 1 516 may set the phase difference between $y^0$ and $y^1$. If the phase difference between $y^0$ and $y^1$ is within the pull-in range window of the loop, the loop will converge. The difference of the converged delay at the delay module 1 516 and the fixed delay at the delay module 0 514 can provide the relative delay between the two signals $x^0$ and $x^1$. If the phase difference between $y^0$ and $y^1$ is outside the pull-in range window of the loop, the loop will diverge. In practice, if the search range of the relative delay (e.g. the 0 to 10 timing range in clock cycles "T" within which the relative delay may exist) is larger than the pull-in range, the calibration procedure may be run multiple times with different initial delays programmed to the delay modules, such that the whole delay range can be covered. If the loop diverges, the initial delay value at delay 1 516 may need to be adjusted to a new value to change the initial phase difference between the signals, and the timing loop run again. If the new initial delay value puts the phase difference between y0 and y1 within the pull-in range, the timing loop can converge. If instead the timing loop diverges, new trials may be run again with new initial delay values until the loop converges.

In an example scenario, it may be known that the head 1 signal $x^1$ may have a relative delay compared to the head 0 signal $x^0$ of some value in the range of [0, 10] (T), with the potential delay range of [0, 10] (T) being the difference of the two signals' delays. It should be noted that there is a difference between the relative delay between the signals $x^0$ and $x^1$, and the delay values set in the delay modules. If setting the delay for head 0 to 11, and setting the delay for head 1 to 10 caused the delayed signals $y^0$ and $y^1$ to be aligned, the relative delay between the signals $x^0$ and $x^1$ is 1 (11−10=1). With a potential delay range of 10 T (e.g. [0, 10] (T)), if the pull-in range of the loop is 2 T (e.g. [−1,1](T)), the timing loop may need to be run up to five times with different initial delay settings in order to cover the entire delay range. The delay of the reference signal at the delay module 0 514 may be fixed to 11 for the five runs, so as to accommodate the potential 10 T delay of the head 1 signal. The initial delay at delay module 1 516 may be set to {2, 4, 6, 8, 10} respectively at the beginning of each run, with each of the runs covering a 2 T pull-in range span. With the head 0 delay fixed to 11, setting the head 1 delay to 10 (so that there is only a 1 T delay difference between them) can have the loop converge if the target head 1 delay is in the range of 9 to 11 (T); e.g. the loop may converge if the relative delay between head 1 and head 0 is in the range of 0 to 2 (T). When the head 1 initial delay is set to 2, the loop may converge if the target head 1 delay is in the range of 1 to 3 (T), with a relative delay coverage of head 1 to head 0 of 8 to 10 (T). With initial head 1 delays of {2, 4, 6, 8, 10}, the timing loop may converge with relative delays between the heads of (8-10, 6-8, 4-6, 2-4, 0-2), respectively. Therefore, running the timing loop five times with these initial delay values for head 1 can cover the relative delay range from 0 to 10 (T). If the actual relative delay between the $x^0$ and $x^1$ signals is 9.3 T, the timing loop may converge when the initial delay for head 1 is set to 2, covering the 8-10 relative delay range, and no additional trials may be required. However, if the actual relative delay is outside the 8-10 range, additional trials may be run until the loop converges.

Running multiple trials may be time-consuming. By expanding the pull-in range of the loop, the number of times the loop would need to be run to cover the possible delay search range could be reduced. Relating to the above example, if the pull-in range is [−2,2](T), covering a 4 T span, the loop may only need to be run three times. Since running three trials with a 4 T span could cover a delay range of 12 T, but the example delay range to be searched is only 10 T, there may be options on what initial delay settings of head 1 may be used, and some search range overlap or coverage extending beyond the potential delay range may be acceptable. For example, initial delay values of {1, 5, 9} may cover relative delays of (8-12, 4-8, 0-4); initial delay values of {2, 6, 9} may cover relative delays of (7-11, 3-7, 0-4); initial delay values of {3, 6, 10} may cover relative delays of (6-10, 3-7, −1-3); etc.

In order to expand pull-in range, the timing error computation used by the timing error generation module 522 may be modified. The timing error can be computed based on minimizing the mean squared error (MSE) between the reference ADC signal $y^0$ and the align ADC signal $y^1$. The gradient can be written approximately as $$\frac{\partial e^2}{\partial \theta} \approx -2(y^1 - y^0)\frac{\partial y^0}{\partial \theta} \quad (1)$$

Thus the timing error (e.g. for each 1 T sampling period) at time k that goes into the loop filter can be written in the following format:

$$e_T(k) = e_s(k) \cdot \text{slope}(k), \quad (2)$$

where the slope represents the derivative in equation (1), and $e_s(k)$ now represents the signal error between the reference and aligning ADC signal at time k.

A way to compute the slope is using the difference between $y^0$ (k+1) and $y^0$ (k−1) to approximate the slope at time k. By doing so, the timing error can be written as $$e_T(k)=(y^1(k)-y^0(k))(y^0(k+1)-y^0(k-1)) \quad (3)$$

By expanding the terms on the right of equation 3, terms such as $y^1(k)y^0$ (k+1) and $y^1(k)y^0$ (k−1) may include the signal to be adjusted. These terms are two of the correlation terms between signal $y^1$ and $y^0$ at time k. Since the timing error may be accumulated at a numerically controlled oscillator (NCO) (e.g. a component of the loop filter 524), including a correlation peak in the terms can create a strong pull from that direction. Adding more correlation terms such as $y^1$ (k)$y^0$ (k+2) and $y^1$ (k)$y^0$ (k−2) into consideration can expand the pull-in range.

Therefore, a mode selection or "gearing" switch can be introduced, which can allow for the inclusion of more terms into the slope computation. An example formula including four selectable gears or "slope modes" is as follows:

$$\text{slope}(k) = \begin{cases} y^0(k+1) - y^0(k-1) & \text{slope\_mode} = 0 \\ \sum_{i=1}^{2} y^0(k+i) - y^0(k-i) & \text{slope\_mode} = 1 \\ \sum_{i=1}^{3} y^0(k+i) - y^0(k-i) & \text{slope\_mode} = 2 \\ \sum_{i=1}^{4} y^0(k+i) - y^0(k-i) & \text{slope\_mode} = 3 \end{cases} \quad (4)$$

In order to limit the noise effect and take small steps when moving the NCO, the slope may also be quantized to a set of discrete values; for example, to only 5 values such as {−2, −1, 0, 1, 2}. A symmetric thresholding of the slope computed in equation (4) may be used. The thresholds in the following equation may be {−$b_1$, −$b_0$, $b_0$, $b_1$}, where $b_0$ and $b_1$ are positive numbers. The quantized slope may be calculated as follows:

$$slope_Q(k) = \begin{cases} -2 & \text{for} \quad slope(k) < -b_1 \\ -1 & \text{for} \quad -b_1 \leq slope(k) < -b_0 \\ 0 & \text{for} \quad -b_0 \leq slope(k) \leq b_0 \\ 1 & \text{for} \quad b_0 < slope(k) \leq b_1 \\ 2 & \text{for} \quad b_1 < slope(k) \end{cases} \quad (5)$$

And the timing error can thus be computed as:

$$e_T(k) = e_s(k) slope_Q(k) \quad (6)$$

The timing error may be sent from the timing error generation module 522 to the loop filter 524. The loop filter 524 can filter out the noisy movement of the timing error. Since the two signals may be delayed with a fixed amount, the timing loop may only need to account for phase error, and not frequency error. Therefore, the loop filter 524 can be a first order filter, the NCO output may be an accumulator with bandwidth control, and most of the noise on the timing error can be filtered out. The output at the NCO can thus be written as:

$$NCO(k) = NCO(k-1) + K_p e_T(k) \quad (7)$$

where $K_p$ may be a bandwidth control of the loop. All or a portion of the NCO(k) value (e.g. the ten highest-order bits) may be added to the initial delay of delay module 1 516 to adjust the applied delay.

Since including more terms into the error computation might introduce unwanted noise as well, the slope mode can be reduced when signs of convergence are observed. Convergence may be determined based on an error metric such as a mean squared error (MSE). During the calibration procedure, the timing error generation module 522 may also generate a signal error between the reference signal and the aligning ADC signal at time k, represented as signal error $e_s(k)$. The MSE can be determined for the two signals as follows:

$$\frac{1}{n}\sum_{i=1}^{n} e_s(i)^2 \quad (8)$$

The MSE may be computed through a feedback loop. For example, when the new $e_s(k)$ is larger than the current MSE, the MSE value may be increased, and when $e_s(k)$ is smaller, the MSE value may be reduced. Eventually the accumulator may be converged to an average value of $e_s(k)^2$.

The produced MSE estimates (or another error metric) can be used to determine whether the signals are converging. If, after some number of cycles (e.g. potentially hundreds or thousands of cycles, depending on the loop bandwidth), the MSE estimates are below a selected threshold value, the signals may be converging. If the MSE estimates are above the threshold, the signals may not be converging and a new trial may be run with a new initial value for delay 1 516. Rather than stopping a trial when the signals are not converging, another approach may be to run trials for all initial delay values to selected completion point, and select the trial result with the smallest MSE value. The trial that produces the smallest MSE value should be the converged trial, assuming that the searched delay range includes the target delay value that will align the signals. This approach may avoid the need to set accurate MSE threshold values to detect convergence.

The error metric (e.g. MSE) or an observation of convergence may be used to determine when to reduce the slope mode. During calibration operations, the largest slope mode may be applied at the beginning of a trial run for a selected memory location (e.g. a selected zone or track). When signs of convergence are observed, such as when the MSE or other selected timing error metric falls below a first threshold, the slope mode may be reduced. This process may repeat with progressively lower MSE thresholds until the timing loop is applying the minimum slope mode, which may produce the most fine-grained delay value with the least noise among the slope modes. Once the minimum slope mode is applied and convergence is observed, the loop may continue running for a period to reduce the noise on the delay results. The fully converged delay value, representing the relative delays between the two heads for the selected location of memory, may then be read out and stored for use during device read operations. The calibration process may then be repeated for other memory locations (e.g. other zones or tracks). The slope mode adjustment procedure can be performed manually or automatically.

The determination of when to change slope modes and when signals have converged may be performed as part of different processes. For example, slope mode changes, and the corresponding threshold monitoring, may be performed by hardware, with the hardware changing the slope mode every time the error metric falls below a threshold. Meanwhile, firmware may be configured to determine whether the timing loop has converged, for example based on an unrelated error metric evaluation. In this manner, the slope mode could be changed based on thresholds even if the loop does not end up converging and the trial fails. For example, a full calibration trial may be run for each of a set of initial delays set at delay 1 516 as discussed herein. If the error metric falls below a threshold during a trial, the hardware may change the slope mode one or more times accordingly. At the end of all the trials, the firmware may look at the error metrics for all the trials and select the trial with the lowest error metric as the trial that converged. Either evaluation maybe performed by a single or different hardware module, software module, or some combination thereof.

Accordingly, the delay calibration circuit 520 may be configured to receive two signals, $y^0$ and $y^1$, with $y^0$ set as a fixed reference signal. The delay calibration circuit 520 may run the signals through a timing loop to align the signals by adjusting the delay or "phase" of the $y^1$ signal. An initial wide timing loop pull-in range may be applied until the signals start to converge, in which case the timing error algorithm can be adjusted to a lower gear setting for reduced noise on the delay results. An example method of performing the described delay calibration and tracking is discussed in regard to FIG. 6.

Figure 6:
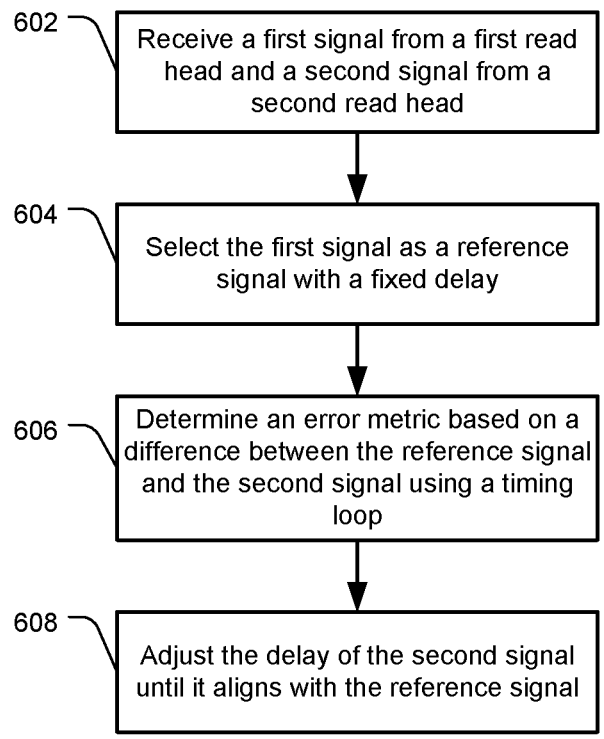
FIG. 6 is a flowchart of a method of head delay tracking and calibration in MSMR systems, in accordance with certain embodiments of the present disclosure.

FIG. 6 is a flowchart of a method of head delay tracking and calibration in MSMR systems, generally designated 600, in accordance with certain embodiments of the present disclosure. The method may be part of a delay calibration process performed by an R/W channel, such as by a delay calibration module 110 of the R/W channel 108 of FIG. 1.

The method 600 may include receiving a first signal from a first read head and a second signal from a second read head, at 602. Each signal may be in the form of a series or string of digital sample values sampled by an ADC from an analog waveform detected by a read head. The first signal and the second signal may correspond to the same recorded data pattern, but offset in time due to a distance between the first head and the second head.

At 604, the method 600 may include selecting the first signal as a reference signal with a fixed delay. In some embodiments, either of the first signal or the second signal may be selected as the reference signal. The reference signal, or the head corresponding to the selected signal, may optionally be selected as the reference signal based on possessing certain selected characteristics. For example, a system may control each read head in a single reader mode, and a head producing the highest SNR or lowest BER may be selected as the reference signal.

The method 600 may include determining one or more error metric based on a difference between the reference signal and the second signal using a timing loop. Error metrics may include timing errors, mean squared errors, or other metrics. As described herein, the signals may be run through a timing error generation module of a timing loop to determine the error metric. For example, the signals may be provided to a least mean square algorithm to determine a phase offset between the signals.

At 608, the method may include using the timing loop to adjust the delay of the second signal until it aligns with the reference signal. Timing loop trials may be run until a convergence or divergence of the signals is detected, or until some selected time or number of clock cycles expires. As the timing loop runs, the convergence may narrow in on the relative delay between the reference signal and the second signal. The timing loop may initially be run with a first slope mode (e.g. applying a first number of correlation terms in the timing error algorithm) having a wide pull-in range, and based on a convergence, the system may change to a second slope mode (e.g. applying a second, lesser number of correlation terms than the first number) having a narrower pull-in range but less noise than the first slope mode. Another example method of delay tracking and calibration is discussed in regard to FIG. 7.

Figure 7:
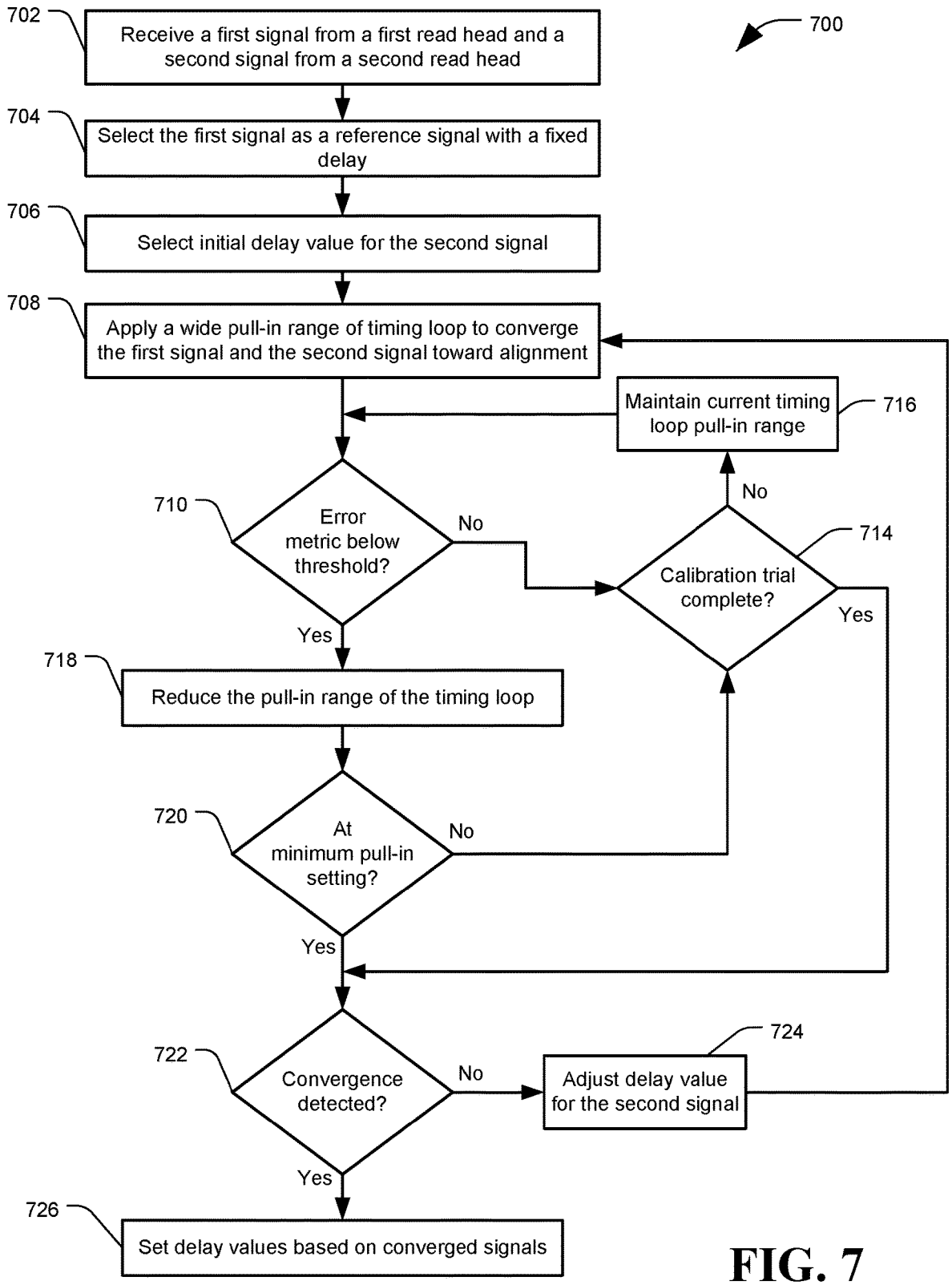
FIG. 7 is a flowchart of a method of head delay tracking and calibration in MSMR systems, in accordance with certain embodiments of the present disclosure.

FIG. 7 is a flowchart of a method of head delay tracking and calibration in MSMR systems, generally designated 700, in accordance with certain embodiments of the present disclosure. The method may be part of a delay calibration process performed by an R/W channel, such as by a delay calibration module 110 of the R/W channel 108 of FIG. 1.

As in method 600, method 700 may include receiving a first signal from a first read head and a second signal from a second read head, at 702, and selecting the first signal as a reference signal with a fixed delay, at 704. The method 700 may include selecting an initial delay value for the second signal, at 706. The delay values for the reference signal and the second signal may be time delays (e.g. in clock cycles "T" or any other delay metric) for which to hold signals before sending them further down the read channel. The delay values may be programmed into delay modules which receive the signals from a corresponding read head and retain the signals for the specified time delay before sending them on. The target delay value for the second signal, which would align the reference signal and the second signal in time, may be within a known possible delay range, based off of a physical down-track offset distance between the first read head and the second read head. For example, at a maximum offset between the heads based on the arm skew over the selected data track, it may be known that the relative timing delay between heads may be no greater than 10 T. The initial delay values for the second signal (e.g. with a new initial delay value selected each time a new calibration trial run is initiated) may be selected from within the potential delay range based on the selected fixed delay value of the reference signal and the pull-in range of the timing loop.

At 708, the method 700 may include applying a wide pull-in range of a timing loop to attempt to converge the first signal and the second signal towards alignment. The reference signal and the second signal may be provided to the timing loop, which may attempt to correct the phase of the second signal to align it with the reference signal by adjusting the delay on the second signal. As discussed herein, the timing loop may have a "pull-in" range or window. The loop may converge if the actual target delay for the second signal that will align the two signals is within the pull-in range of the selected initial delay value for the second signal, with the range centered on the initial delay value. The width of the pull-in range may be adjustable based on a slope mode of the timing error equation applied by the timing loop. A higher slope mode may include more correlation terms and have a wide pull-in range but produce a noisy output, while a lower slope mode may include fewer correlation terms and have a narrow pull-in range, but produce very little noise.

In an example embodiment, it may be known that the relative delay between the heads is within a range of [0, 8](T). The delay on the reference signal may be set to 12. The initial widest pull-in range setting of the timing loop may be a 4 T span of [−2, 2](T). With a 4 T pull-in range and up to 8 T potential delay, a converging loop should be achievable within two calibration trial runs. Accordingly, the initial delay value for the second signal may be selected from example values such as {6, 10}, which may allow the loop to converge for actual relative delay ranges between the heads of (4-8, 0-4) respectively.

At 710, the method 700 may include producing an error metric based on a comparison of the two signals, and determining whether the selected error metric is below a selected threshold value. For example, the mean square error value from comparing the signals may be compared to a first slope mode adjustment threshold, or "gearing" threshold.

If the error metric is not below the first threshold, the method 700 may include determining whether the calibration trial run is complete, at 714. Each trial run may run for a selected number of clock cycles, until the error metrics indicate that the loop has converged or is diverging (e.g. based on convergence or divergence error metric thresholds), or for some other period. A calibration trial run may complete without the error metrics ever falling below the first gearing threshold. If the calibration trial run is not completed, at 714, the method 700 may include maintaining the current timing loop pull-in range (e.g. the current slope mode or "gear" of the timing loop), at 716, and continuing to monitor whether the error metric falls below the threshold, at 710. While the timing loop continues to run, the delay of the second signal may be gradually adjusted by the timing loop, which may result in the error metric getting smaller or larger.

If the error metric falls below the selected threshold, at 710, the method 700 may include reducing the pull-in range of the timing loop, at 718. Reducing the pull-in range may include, e.g. shifting the timing loop from slope mode 3 to slope mode 2, thereby decreasing the number of correlation terms of the timing error equation while reducing the noise of the delay value output. If the gearing threshold is appropriately set, lowering the pull-in range of timing loop may not result in "losing" convergence.

A determination may be made whether the timing loop is at a minimum pull-in setting (e.g. a minimum slope mode), at 720. If not, the method 700 may include determining whether the calibration trial run has completed, at 714. It may be possible for the calibration trial run to complete without ever reaching a minimum slope mode or pull-in range, depending on selected gear changing or convergence thresholds. If the calibration trial is not complete, the method may include continuing to adjust the second signal delay based on the current pull-in range settings, at 716 until the pull-in range can be further reduced or the trial run completes.

If the pull-in range is at the minimum setting, at 720, or if a determination is made that the calibration trial has completed, at 714, the method 700 may include determining whether the timing loop converged during the calibration trial run, at 722. In some examples, convergence may be detected if a selected error metric (which may be the same or a different error metric used to determine when to reduce the pull-in range) falls below a convergence threshold. The trial may be aborted prematurely if the error metric ever falls below the convergence threshold, or a determination may be made once the calibration trial has elapsed a predetermined duration. In some embodiments, a determination on a converging trial may be made once calibration trials have been run for a preselected set of initial delay values for the second signal, with the trial having the lowest selected error metric being chosen as the converging trial.

If convergence was not detected, at 722, the method 700 may include adjusting the initial delay value of the second signal and performing another timing loop trial, at 724. Adjusting the delay value may adjust the initial relative delay or phase difference between the reference signal and the second signal, which may allow the timing loop to converge on subsequent timing loop trials.

If convergence is detected, at 722, the method 700 may include setting the delay value for the second signal, the reference signal, or both, based on the converged signals. Setting the delay values may include storing the relative delay between the first head and the second head, or delay values to apply to each head, so that the delay information can be retrieved and applied during normal read operations. Once the delay is determined, the delay values applied to both heads may be adjusted so that a minimal delay is applied for the leading head. For example, if the reference head was set to a delay of 11, and the timing loop converged on a delay value of 8.6 for the second head, the delays of both heads may be adjusted so that both remain positive, while keeping the lowest delay value minimal. In this example, the calibration trial delays of 11 and 8.6 may be reduced by 8, so that the final delays to apply during normal read operations may be set to 0.6 and 3, respectively.

The calibration process for tracking and calibrating the delays between heads may be run again for a different pair of heads, for example in a system with more than two readers. The calibration process may be run, and the delay value(s) stored, for each pair of heads for each zone of a memory, for a selected one or more tracks, or for other memory space increments to correlate specific delays with specific regions of the memory. A diagram of an example drive configured to perform head delay tracking and calibration is discussed in regard to FIG. 8.

Figure 8:
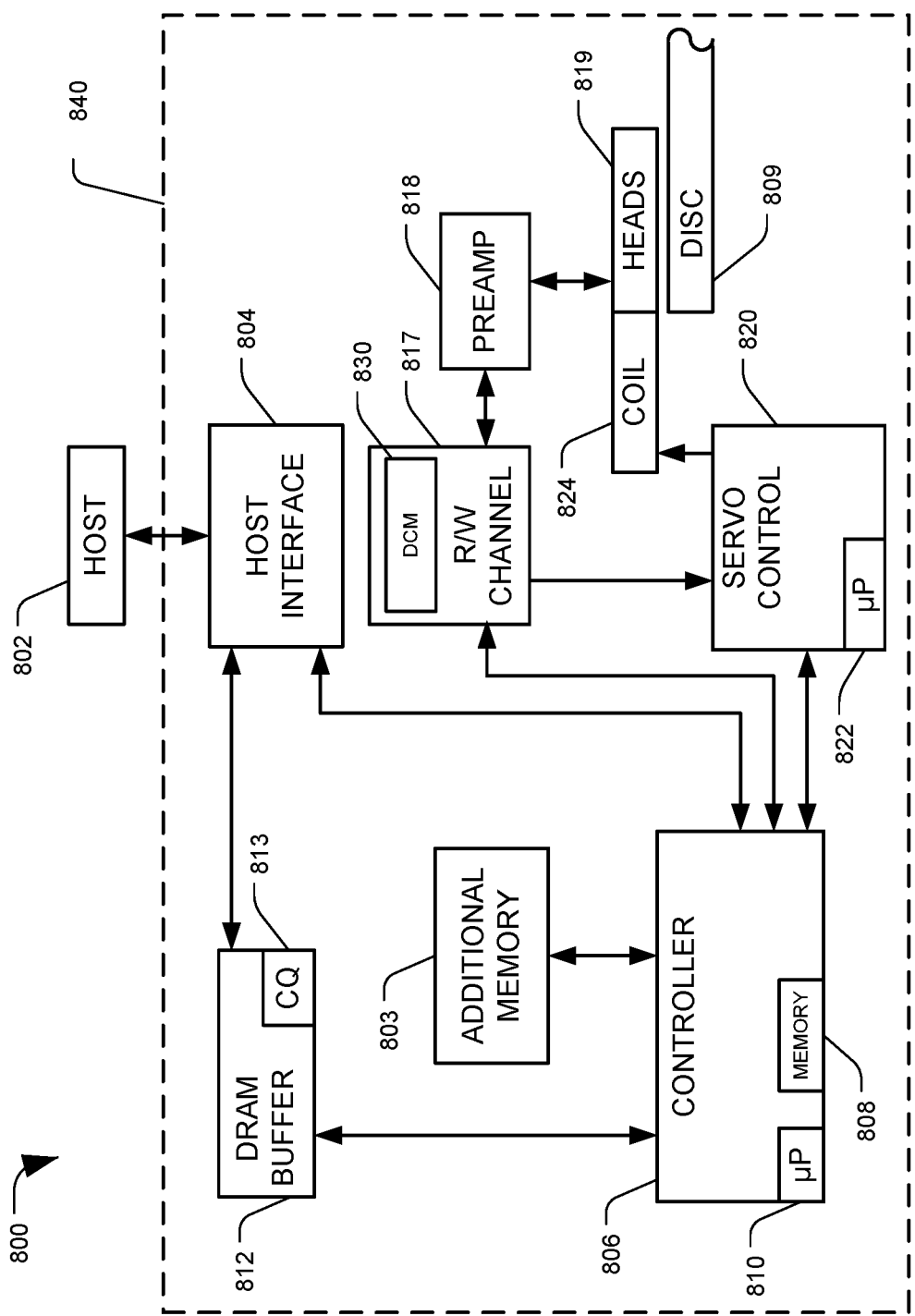
FIG. 8 is a diagram of an MSMR system configured to perform head delay calibration and tracking, in accordance with certain embodiments of the present disclosure.

FIG. 8 depicts a diagram of a system, generally designated 800, configured to perform head delay tracking and calibration in MSMR system, in accordance with certain embodiments of the present disclosure. Specifically, FIG. 8 provides a functional block diagram of an example data storage device (DSD) 800, which may be an embodiment of the data storage device 104 of FIG. 1.

The DSD 800 can communicate with a host device 802 via a hardware or firmware-based interface circuit 804. The host 802 may also be referred to as the host system or host computer. The host 802 can be a desktop computer, a laptop computer, a server, a tablet computer, a telephone, a music player, another electronic device, or any combination thereof. Similarly, the DSD 808 may be any of the above-listed devices, or any other device which may be used to store or retrieve data, such as a hard disc drive (HDD). The host 802 may be an end-user system that issues input/output (I/O) commands to the DSD 200, or the host 802 may be a system employed by a manufacturer or vendor of the DSD 200 and used to perform initial setup and calibration of the DSD 200. The interface 804 may comprise any interface that allows communication between a host 802 and a DSD 800, either wired or wireless, such as USB, IEEE 1394, Compact Flash, SATA, eSATA, PATA, SCSI, SAS, PCIe, Fibre Channel, Ethernet, or Thunderbolt, among others. The interface 804 may include a connector (not shown) that allows the DSD 800 to be physically removed from the host 802. The DSD 800 may have a casing 840 housing the components of the DSD 800, or the components of the DSD 800 may be attached to the housing, or a combination thereof. The DSD 800 may communicate with the host 802 through the interface 804 over wired or wireless communication.

The buffer 812 can temporarily store data during read and write operations, and can include a command queue (CQ) 813 where multiple pending operations can be temporarily stored pending execution. Commands arriving over the interface 804 may automatically be received in the CQ 813 or may be stored there by controller 806, interface 804, or another component.

The DSD 800 can include a programmable controller 806, which can include associated memory 808 and processor 810. The controller 806 may control data access operations, such as reads and writes, to one or more disc memories 809. The DSD 800 may include an additional memory 803 instead of or in addition to disc memory 809. For example, additional memory 803 can be a solid state memory, which can be either volatile memory such as DRAM or SRAM, or non-volatile memory, such as NAND Flash memory. The additional memory 803 can function as a cache and store recently or frequently read or written data, or data likely to be read soon. Additional memory 803 may also function as main storage instead of or in addition to disc(s) 809. A DSD 800 containing multiple types of nonvolatile storage mediums, such as a disc(s) 809 and Flash 803, may be referred to as a hybrid storage device.

The DSD 800 can include a read-write (R/W) channel 817, which can encode data during write operations and reconstruct user data retrieved from a memory, such as disc(s) 809, during read operations. A preamplifier circuit (preamp) 818 can apply write currents to the heads 819 and provides pre-amplification of read-back signals. In some embodiments, the preamp 818 and heads 819 may be considered part of the R/W channel 817. A servo control circuit 820 may use servo data to provide the appropriate current to the coil 824, sometimes called a voice coil motor (VCM), to position the heads 819 over a desired area of the disc(s) 809. The controller 806 can communicate with a processor 822 to move the heads 819 to the desired locations on the disc(s) 809 during execution of various pending I/O commands in the command queue 813.

DSD 800 may include a delay calibration module (DCM) 830, for example in the R/W channel 817, the controller 806, distributed among multiple components, as one or more stand-alone circuits, or any combination thereof. The DCM 110 may perform the methods and processes described herein to determine and set a delay between the heads 819 at various locations of the disc 809, such that the read signals can be aligned in time and coherently combined to improve system performance.

Although the foregoing examples provided herein are directed to R/W channels in an MSMR data storage device, the teachings are not limited thereto and can be applied to any multi-receiver data processing channel, such as a system with multiple wireless signal antennae and a wireless signal processing channel. Any multi-receiver system may have delays between when a signal is received at each receiver, and may benefit from delay calibration of the receivers. Furthermore, components can be added, rearranged, or removed from the provided example embodiments without departing from the scope of the present disclosure.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Moreover, although specific embodiments have been illustrated and described herein, it should be appreciated that any subsequent arrangement designed to achieve the same or similar purpose may be substituted for the specific embodiments shown.

This disclosure is intended to cover any and all subsequent adaptations or variations of various embodiments. Combinations of the above embodiments, and other embodiments not specifically described herein, will be apparent to those of skill in the art upon reviewing the description. Additionally, the illustrations are merely representational and may not be drawn to scale. Certain proportions within the illustrations may be exaggerated, while other proportions may be reduced. Accordingly, the disclosure and the figures are to be regarded as illustrative and not restrictive.

What is claimed is:

1. An apparatus comprising:
   a circuit configured to:
     determine a relative offset between a first reader and a second reader configured to simultaneously read from a single track of a data storage medium, the first reader being offset from the second reader such that the first reader and the second reader detect a same data signal that is offset in time relative to each other;
     adjust an adjustable delay of a second signal from the second reader based on the relative offset to align the second signal to a first signal from the first reader using a timing loop, with the first signal used as a reference signal; and
     execute read operations based on the relative offset.

2. The apparatus of claim 1 further comprising:
   the circuit is configured to determine the relative offset between the first reader and the second reader, including:
     set a fixed delay for the first signal;
     set an initial second delay for the second signal; and
     adjust the initial second delay as the adjustable delay based on the timing loop.

3. The apparatus of claim 2 comprising the circuit further configured to selectively choose between the first signal and the second signal to use as the reference signal and to which to apply the fixed delay.

4. The apparatus of claim 1 further comprising:
   the circuit configured to determine the relative offset, further including:
     determine a timing error based on a phase difference between the first signal and the second signal; and
     adjust the adjustable delay based on the timing error.

5. The apparatus of claim 1 further comprising:
   the circuit includes a read channel, including:
     a separate data path for each of the first reader and the second reader, each data path including:
       an analog to digital converter (ADC), configured to sample an analog signal from a respective reader and output the respective first signal and second signal comprising a sequence of digital sample values;
       a delay module configured to receive the respective first signal and second signal from the respective ADC, and delay the first signal by a first delay and delay the second signal by the adjustable delay;
     a delay calibration module including the timing loop and configured to:
       receive the first signal and the second signal from the respective delay modules; and
       set the first delay and adjust the adjustable delay at the respective delay modules.

6. The apparatus of claim 1 further comprising:
   the timing loop includes multiple selectable settings, including:
     a first mode having a first pull-in range and a first noise output level, the first pull-in range defining a timing window in clock cycles centered around the adjustable delay, wherein the timing loop will converge if an actual delay between the first reader and the second reader is within the timing window; and
     a second mode having a second pull-in range narrower than the first pull-in range, and a second noise level less than the first noise level.

7. The apparatus of claim 6 comprising the circuit further configured to:
   apply the first mode when a delay calibration process is initiated; and
   switch to the second mode when the timing loop converges.

8. The apparatus of claim 7 comprising the circuit further configured to:
   set the adjustable delay to an initial delay value when the delay calibration process is initiated;
   determine if the timing loop is converging based on an error metric;
   change the initial delay value when the timing loop is not converging; and
   switch to the second mode when the error metric is below a threshold value.

9. The apparatus of claim 8 further comprising the error metric is based on a mean squared error of a signal error between the first signal and the second signal.

10. A method comprising:
    determining a relative offset between a first reader and a second reader configured to simultaneously read from a single track of a data storage medium, the first reader being offset from the second reader such that the first reader and the second reader detect a same data signal that is offset in time relative to the other reader;

adjusting an adjustable delay of a second signal from the second reader based on the relative offset to align the second signal to a first signal from the first reader using a timing loop, with the first signal used as a reference signal; and executing read operations based on the relative offset.

11. The method of claim 10 further comprising:
determining the relative offset between the first reader and the second reader includes:
  setting a fixed delay for the first signal;
  setting an initial second delay for the second signal;
  adjusting the initial second delay as the adjustable delay based on the timing loop; and
  storing delay values for the first reader and the second reader based on the relative offset.

12. The method of claim 11 further comprising selectively choosing between the first signal and the second signal to use as the reference signal and to which to apply the fixed delay.

13. The method of claim 10 further comprising:
determining the relative offset further includes:
  determining a timing error based on a phase difference between the first signal and the second signal; and
  adjusting the adjustable delay based on the error metric.

14. The method of claim 10 further comprising:
applying a first mode of the timing loop when a delay calibration process is initiated, the first mode having a first pull-in range and a first noise output level, the first pull-in range defining a timing window in clock cycles centered around the adjustable delay, wherein the timing loop will converge if an actual delay between the first reader and the second reader is within the timing window; and
switching to a second mode of the timing loop when the timing loop converges, the second mode having a second pull-in range narrower than the first pull-in range, and a second noise level less than the first noise level.

15. The method of claim 14 further comprising:
setting the adjustable delay to an initial delay value when the delay calibration process is initiated;
determining if the timing loop is converging based on an error metric;
changing the initial delay value when the timing loop is not converging; and
switching to the second mode when the error metric is below a threshold value.

16. An apparatus comprising:
a read channel configured to:
  receive a first signal corresponding to a data track of a data storage medium from a first read head;
  receive a second signal corresponding to the data track from a second read head, the second read head offset in a down track direction from the first read head, resulting in a time offset between the second signal and the first signal;
  select the first signal as a reference signal having a fixed delay;
  determine an error metric corresponding to the time offset based on a difference between the reference signal and the second signal using a timing loop;
  adjust a second delay of the second signal until the second signal is aligned to the reference signal based on the error metric; and
  read data based on the fixed delay and the second delay once the second signal is aligned to the reference signal.

17. The apparatus of claim 16, the read channel comprising:
a first analog to digital converter (ADC) configured to sample a first analog signal from the first read head to output the first signal comprising a sequence of digital sample values;
a second ADC configured to sample a second analog signal from the second read head to output the second signal;
a first delay module configured to receive the first signal and apply the fixed delay;
a second delay module configured to receive the second signal and apply the second delay;
a delay calibration module configured to:
  receive the first signal and the second signal from the respective first delay module and second delay module; and
  set the fixed delay and the second delay.

18. The apparatus of claim 17, the read channel further comprising:
the timing loop, the timing loop having multiple selectable settings, including:
  a first mode having a first pull-in range and a first noise output level, the first pull-in range defining a timing window in clock cycles centered around the second delay, wherein the timing loop will converge if an actual delay between the first read head and the second read head is within the timing window; and
  a second mode having a second pull-in range narrower than the first pull-in range, and a second noise level less than the first noise level;
the read channel is further configured to:
  apply the first mode when a delay calibration process is initiated; and
  switch to the second mode when the timing loop converges.

19. The apparatus of claim 18, further comprising:
the first mode having a first number of correlation terms used in a slope calculation of the timing error; and
the second mode having a second number of correlation terms used in the slope calculation that is fewer than the first number of correlation terms;
the read channel further configured to:
  set the second delay to an initial delay value when the delay calibration process is initiated;
  determine if the timing loop is converging based on an error metric generated by the timing loop based on a phase difference between the reference signal and the second signal;
  change the initial delay value when the timing loop is not converging; and
  switch to the second mode when the error metric is below a threshold value.

20. The apparatus of claim 18, further comprising:
the read channel configured to determine the relative offset, further including:
  determine a timing error based on a mean square error calculation of a phase difference between the first signal and the second signal;
  adjust the second delay based on the error metric.

* * * * *